United States Patent
Fan

(10) Patent No.: US 11,894,083 B2
(45) Date of Patent: *Feb. 6, 2024

(54) SIGNAL WIDTH REPAIR CIRCUIT AND METHOD, AND ELECTRONIC DEVICE

(71) Applicant: CHANGXIN MEMORY TECHNOLOGIES, INC., Hefei (CN)

(72) Inventor: Xian Fan, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 274 days.

This patent is subject to a terminal disclaimer.

(21) Appl. No.: 17/501,190

(22) Filed: Oct. 14, 2021

(65) Prior Publication Data

US 2022/0230696 A1 Jul. 21, 2022

Related U.S. Application Data

(63) Continuation of application No. PCT/CN2021/110387, filed on Aug. 3, 2021.

(30) Foreign Application Priority Data

Jan. 20, 2021 (CN) .......................... 202110073646.2

(51) Int. Cl.
*G11C 29/02* (2006.01)
(52) U.S. Cl.
CPC .................. *G11C 29/028* (2013.01)
(58) Field of Classification Search
CPC .. G11C 29/028; G11C 29/023; G11C 29/5001
USPC ......................................................... 714/4.3
See application file for complete search history.

(56) References Cited

U.S. PATENT DOCUMENTS

| 7,154,323 | B2 | 12/2006 | Yamawaki |
| 10,236,871 | B2 | 3/2019 | Chan |
| 11,463,073 | B2 * | 10/2022 | Fan .......................... H03K 5/01 |
| 2002/0084857 | A1 | 7/2002 | Kim |
| 2005/0168259 | A1 | 8/2005 | Yamawaki |
| 2013/0021074 | A1 * | 1/2013 | Finn .................. H04L 25/03885 327/162 |
| 2018/0123576 | A1 | 5/2018 | Chan |

FOREIGN PATENT DOCUMENTS

| CN | 107820678 A | 3/2018 |
| CN | 108023577 A | 5/2018 |
| CN | 112003593 A | 11/2020 |
| CN | 112865781 A | 5/2021 |
| JP | H10311856 A | 11/1998 |

* cited by examiner

*Primary Examiner* — Yair Leibovich
(74) *Attorney, Agent, or Firm* — Cooper Legal Group, LLC

(57) ABSTRACT

A signal width repair circuit and method, and an electronic device are provided. The signal width repair circuit includes: a delay unit, configured to receive an input signal, and delay the input signal for a preset duration to obtain a delayed signal, the input signal being a low-level signal; a signal reconstruction unit, configured to receive the input signal and the delayed signal, and repair the input signal and the delayed signal to obtain a repaired signal; and a signal selection unit, configured to receive the input signal and the repaired signal and select one of the input signal and the repaired signal for output, to obtain a target signal that has a width satisfying a preset width, the preset duration being equal to or greater than a duration with the preset width.

20 Claims, 16 Drawing Sheets

| A delay unit is controlled to receive an input signal, and the input signal is delayed for a preset duration by the delay unit to obtain a delayed signal, the input signal being a low-level signal | — S1610 |

| A signal reconstruction unit is controlled to receive the input signal and the delayed signal, and the input signal and the delayed signal are repaired by the signal reconstruction unit to obtain a repaired signal | — S1620 |

| A signal selection unit is controlled to receive the input signal and the repaired signal, and one of the input signal and the repaired signal is selected for output by the signal selection unit, to obtain a target signal that has a width satisfying a preset width, the preset duration being equal to or greater than a duration with the preset width | — S1630 |

SIGNAL WIDTH REPAIR CIRCUIT AND METHOD, AND ELECTRONIC DEVICE

CROSS-REFERENCE TO RELATED APPLICATIONS

This is a continuation application of International Patent Application No. PCT/CN2021/110387, filed on Aug. 3, 2021, which claims priority to Chinese Patent Application No. 202110073646.2, filed on Jan. 20, 2021 and entitled "SIGNAL WIDTH REPAIR CIRCUIT AND METHOD, AND ELECTRONIC DEVICE". The disclosures of International Patent Application No. PCT/CN2021/110387 and Chinese Patent Application No. 202110073646.2 are hereby incorporated by reference in their entireties.

BACKGROUND

In application fields of integrated circuits, normal operation of a next-stage circuit depends on whether a signal generated by a present-stage circuit satisfies a minimum use requirement.

SUMMARY

The present disclosure relates to the technical field of integrated circuits, and in particular to a signal width repair circuit, a signal width repair method and an electronic device.

According to an aspect of the present disclosure, there is provided a signal width repair circuit, which includes: a delay circuit, configured to receive an input signal and delay the input signal for a preset duration to obtain a delayed signal, the input signal being a low-level signal; a signal reconstruction circuit, configured to receive the input signal and the delayed signal, and repair the input signal and the delayed signal to obtain a repaired signal; and a signal selection circuit, configured to receive the input signal and the repaired signal, and select one of the input signal and the repaired signal for output, to obtain a target signal that has a width satisfying a preset width, the preset duration being equal to or greater than a duration with the preset width.

According to an aspect of the present disclosure, a signal width repair method is provided, and the method is applied to a signal width repair circuit including a delay circuit, a signal reconstruction circuit and a signal selection circuit. The signal width repair method includes the following operations. The delay circuit is controlled to receive an input signal, and the delay circuit delays the input signal for a preset duration to obtain a delayed signal, the input signal being a low-level signal. The signal reconstruction circuit is controlled to receive the input signal and the delayed signal, and the signal reconstruction circuit repairs the input signal and the delayed signal to obtain a repaired signal. The signal selection circuit is controlled to receive the input signal and the repaired signal, and the signal selection circuit is configured to select one of the input signal and the repaired signal for output, to obtain a target signal that has a width satisfying a preset width, the preset duration being equal to or greater than a duration with the preset width.

According to an aspect of the present disclosure, there is provided an electronic device, which includes a signal width repair circuit. The signal width repair circuit includes: a delay circuit, configured to receive an input signal and delay the input signal for a preset duration to obtain a delayed signal, the input signal being a low-level signal; a signal reconstruction circuit, configured to receive the input signal and the delayed signal, and repair the input signal and the delayed signal to obtain a repaired signal; and a signal selection circuit, configured to receive the input signal and the repaired signal, and select one of the input signal and the repaired signal for output, to obtain a target signal that has a width satisfying a preset width, the preset duration being equal to or greater than a duration with the preset width.

It should be understood that the above general descriptions and detailed descriptions below are only exemplary and explanatory and not intended to limit the present disclosure.

BRIEF DESCRIPTION OF THE DRAWINGS

The accompanying drawings, which are incorporated in and constitute a part of this specification, illustrate embodiments consistent with the present disclosure and, together with the description, serve to explain the principles of the present disclosure. It is apparent that the accompanying drawings in the description below are merely some of the embodiments of the disclosure, based on which other drawings may be obtained by a person of ordinary skill in the art without any creative effort.

DETAILED DESCRIPTION

Figure 1:
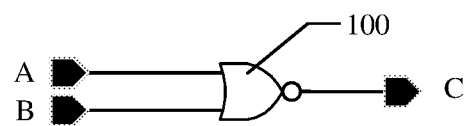
FIG. 1 schematically illustrates a structure diagram of a logic circuit in the related art.

Exemplary embodiments will now be described more fully with reference to the accompanying drawings. However, the exemplary embodiments may be implemented in a various forms and should not be understood as being limited to the examples set forth herein. Rather, these embodiments are provided to make the present disclosure more thorough and complete, and to fully convey the concepts of the example embodiments to those skilled in the art. The same reference numerals in the figures donate the same or similar structures, and thus the detailed descriptions thereof will be omitted.

Although relative terms, such as "on" and "under", are used in this description to describe a relative relationship and between one component labeled in the drawing and another component, these terms are used in this description only for convenience, for example, according to the directions of the examples described in the drawings. It is to be understood that if a component labeled in the drawing is flipped upside down, a component described as being "on" another component will become a component being "under" another component. Other relative terms, such as "high", "low", "top", "bottom", "left" and "right", also have the similar meanings. When a structure is located "on" another structure, it may mean that the structure is integrally formed on another structure, or the structure is "directly" disposed on another structure, or the structure is "indirectly" disposed on another structure through yet another structure.

The terms "one", "a/an" and "the" are used to donate the presence of one or more elements/components/etc. The terms "include" and "have" are used in an open-type inclusive sense and mean that there may be additional elements/components/etc., in addition to the listed elements/components/etc.

In a process of signal transmission in an integrated circuit, when there is a time difference between two signals input to a certain circuit, a width of a signal output by the circuit may be narrowed, and even an actual requirement may not be satisfied. For example, in signal transmission in the present-stage circuit, a width of the signal finally generated by the present-stage circuit may not satisfy the minimum use requirement of the next-stage circuit due to mismatch in time between signals or an overlong transmission path of the signals. Therefore, the normal operation of the next-stage circuit is affected.

Figure 2:
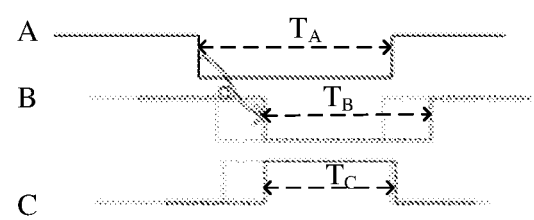
FIG. 2 schematically illustrates a waveform diagram corresponding to the logic circuit in FIG. 1.

For example, as illustrated in FIG. 1 and FIG. 2, a signal A and a signal B pass through a logic gate circuit 100. TB is later than TA by α due to a time difference with length α between the signal A and signal B. As a result, a width TC of an output signal C is smaller than a width TA of the signal A by length α after the two signals pass through the logic gate circuit 100. Therefore, signal C may not satisfy the minimum use requirement of the next-stage circuit, and the normal operation of the next-stage circuit may be affected.

Figure 3:
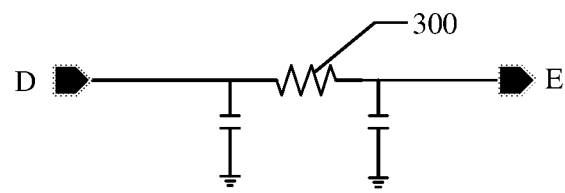
FIG. 3 schematically illustrates a structure diagram of a long-distance transmission circuit in the related art.
Figure 4:
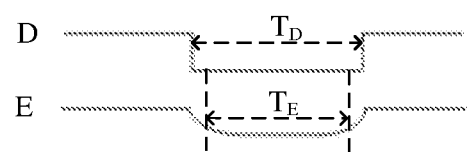
FIG. 4 schematically illustrates a waveform diagram corresponding to the long-distance transmission circuit in FIG. 3.

In another case, as illustrated in FIG. 3 and FIG. 4, after a signal D passes through a long-distance line 300, the signal D is attenuated, and the width of an output signal E may be narrowed and even distorted. Further, the minimum use requirement of the next-stage circuit may not be satisfied and the normal operation of the next-stage circuit may be affected. As illustrated in FIG. 4, the width TE of the signal E is apparently smaller than the width TD of the signal D.

Based on the above, an exemplary embodiment provides a signal width repair circuit which performs a width expansion on a signal with a width smaller than the actual use requirement, to enable the width of the expanded signal to satisfy the actual use requirement. In addition, a signal with a width originally satisfying or even greater than the actual use requirement is not affected.

Figure 5:
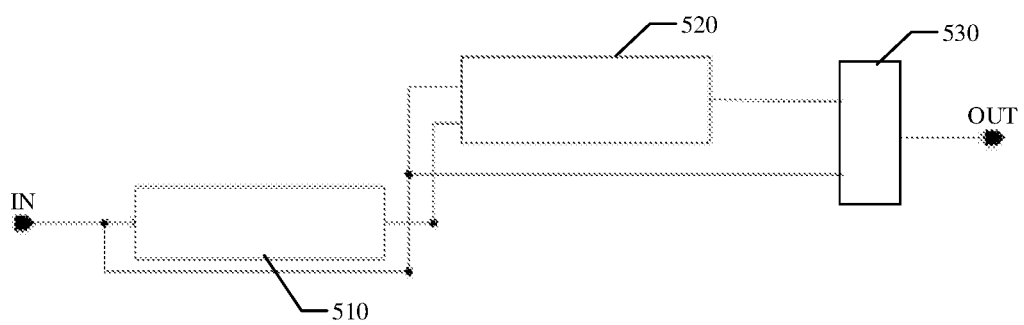
FIG. 5 schematically illustrates a structure diagram of a signal width repair circuit according to an exemplary embodiment of the present disclosure.

FIG. 5 schematically illustrates a structure diagram of a signal width repair circuit according to an exemplary embodiment of the present disclosure. As illustrated in FIG. 5, the signal width repair circuit includes a delay unit 510, a signal reconstruction unit 520 and a signal selection unit 530.

The delay unit 510 is configured to receive an input signal and delay the input signal for a preset duration to obtain a delayed signal. The input signal is a low-level signal. The delayed signal is obtained based on the input signal, and in the subsequent signal processing process, a signal width may be repaired based on the input signal and the delayed signal.

It should be noted that the input signal herein may be the above-mentioned signal C or signal E which has a small signal width, i.e. a signal with a width that does not satisfy the actual use requirement.

The signal reconstruction unit 520 is configured to receive the input signal and the delayed signal and repair the input signal and the delayed signal to obtain a repaired signal. In the exemplary embodiment, a width of the obtained repaired signal is equal to or greater than a preset width.

The signal selection unit 530 is configured to receive the input signal and the repaired signal, and select one of the input signal and the repaired signal for output, to obtain a target signal that has a width satisfying a preset width. The preset duration is equal to or greater than a duration with the preset width. By selectively outputting one of the input signal and the repaired signal, the target signal with a width satisfying the preset width can be obtained.

The exemplary embodiment of the present disclosure provides a signal width repair circuit which is mainly for processing a case where an input signal is a low-level signal. By receiving an input signal and a delayed signal by the signal reconstruction unit, the input signal is repaired and a repaired signal is obtained. By selectively outputting one of the input signal and the repaired signal by the signal selection unit, a target signal that has a width satisfying a preset width can be obtained. Therefore, the width of the input signal can be repaired, and the signal passing through the signal width repair circuit can finally satisfy the use requirement of the preset width.

The specific structure and function of the signal width repair circuit provided in the exemplary embodiment of the present disclosure will be further described below.

Figure 6:
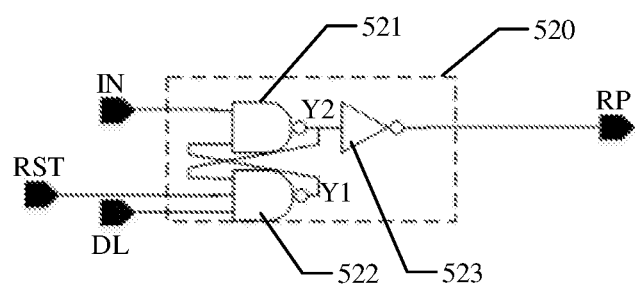
FIG. 6 schematically illustrates a structure diagram of a signal reconstruction unit in a signal width repair circuit according to an exemplary embodiment of the present disclosure.

FIG. 6 schematically illustrates a structure diagram of a signal reconstruction unit according to an exemplary embodiment of the present disclosure. In the exemplary embodiment, the signal reconstruction unit 520 may include a first NAND gate 521, a second NAND gate 522 and a first NOT gate 523.

Input ends of the first NAND gate 521 are respectively connected with an input signal IN and an output signal Y1 of the second NAND gate 522. The first NAND gate 521 is a two-input NAND gate.

Input ends of the second NAND gate 522 are respectively connected with a system reset signal RST, a delayed signal DL and an output signal Y2 of the first NAND gate 521. The delayed signal DL is obtained by delaying the input signal IN for a preset duration. The second NAND gate 522 is a three-input NAND gate.

An input end of the first NOT gate 523 is connected with an output end of the first NAND gate 521, i.e. the input end of the first NOT gate 523 receives the output signal Y2 of the first NAND gate 521. An output end of the first NOT gate 523 is configured to output a repaired signal RP that has a width satisfying the preset width.

Figure 7:
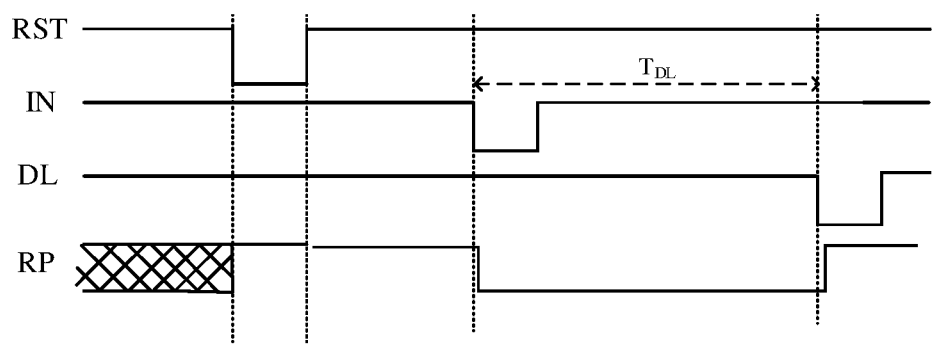
FIG. 7 schematically illustrates a waveform diagram of a signal passing through a signal reconstruction unit provided in an exemplary embodiment of the present disclosure.

FIG. 7 schematically illustrates a waveform diagram of a signal passing through a signal reconstruction unit provided in an exemplary embodiment of the present disclosure. As illustrated in FIG. 7, the signal reconstruction unit 520 provided in the exemplary embodiment of the present disclosure is a low-enabled unit which is enabled when the input signals become a low-level. Before the system reset signal RST is reset, i.e. before the system reset signal RST is input as a low-level signal to the second NAND gate 522, the repaired signal RP output by the signal reconstruction unit 520 is unknown, specifically, the previous signal is kept, as illustrated in Table 1.

When the system reset signal RST input to the second NAND gate 522 is a low-level signal, i.e., RST becomes signal 0, when RST is signal 0, the output signal Y1 of the second NAND gate 522 becomes signal 1. Since the input signal IN and the output signal Y1 of the second NAND gate 522 are both signal 1, the output signal Y2 of the first NAND gate 521 is signal 0 after the first NAND gate 521 is passed through. Finally, after the output signal Y2 which is signal 0 passes through the first NOT gate 523, the repaired signal RP becomes signal 1.

Then, when the input signal IN input to the first NAND gate 521 is a low-level signal, i.e., the input signal IN becomes signal 0, the output signal Y2 of the first NAND gate 521 becomes signal 1, and then the repaired signal RP becomes signal 0 after the first NOT gate 523 is passed through. In this case, the repaired signal RP is not affected by the delayed signal DL, i.e., the delayed signal DL may be arbitrary.

When the delayed signal DL input to the second NAND gate 522 is changed to a low-level signal, i.e., the delayed signal DL becomes signal 0, the output signal Y1 of the second NAND gate 522 becomes signal 1, signal inversion of the first NAND gate 521 may occurred when the input signal IN is signal 1, then the output signal Y2 becomes signal 0. Therefore, the final repaired signal RP becomes signal 1.

As illustrated in FIG. 7, a duration between a start time when the input signal IN becomes a low-level and a start time when the delayed signal DL becomes a low-level is denoted as TDL, which is a delay of the delayed signal DL, i.e., the preset duration. Moreover, TDL is also a duration with the width of the output repaired signal RP. Since the preset duration is equal to or greater than a duration with the preset width, the width of the repaired signal RP satisfies the preset width requirement.

TABLE 1

| RST | IN | DL | RP |
| --- | --- | --- | --- |
| 1 | 1 | 1 | Keep |
| 0 | 1 | 1 | 1 |
| 1 | 0 | Arbitrary | 0 |
| 1 | 1 | 0 | 1 |

Figure 8:
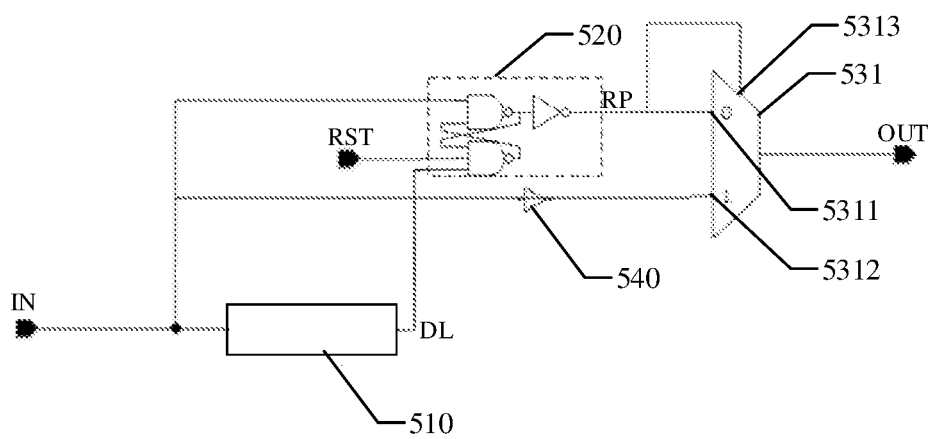
FIG. 8 schematically illustrates a structure diagram of a signal width repair circuit with a signal selection unit being a first multiplexer according to an exemplary embodiment of the present disclosure.

In an exemplary embodiment of the present disclosure, the signal selection unit 530 may be a first multiplexer 531. FIG. 8 schematically illustrates a structure diagram of a signal width repair circuit with a signal selection unit being a first multiplexer according to an exemplary embodiment of the present disclosure.

As illustrated in FIG. 8, input ends 5311 and 5312 of the first multiplexer 531 respectively receive the repaired signal RP and the input signal IN, i.e., the input end 5311 of the first multiplexer 531 is connected with the output end of the signal reconstruction unit 520. A control end 5313 of the first multiplexer 531 receives the repaired signal RP, and an output end of the first multiplexer 531 is configured to output a target signal OUT. The first multiplexer 531 may be configured to select the repaired signal RP for output when the repaired signal RP is signal 0, and select the input signal IN for output when the repaired signal RP is signal 1.

In the exemplary embodiment, the input signal IN is input to input end 1 of the first multiplexer 531, that is, the input end 5312 of the first multiplexer 531 is input end 1. The repaired signal RP is input to input end 0 of the first multiplexer 531, that is, the input end 5311 of the first multiplexer 531 is input end 0. When the repaired signal RP is signal 0, the first multiplexer 531 is configured to select the repaired signal RP for output; when the repaired signal RP is signal 1, the first multiplexer 531 selects the input signal IN for output. A specific waveform diagram may refer to FIG. 9.

Figure 9:
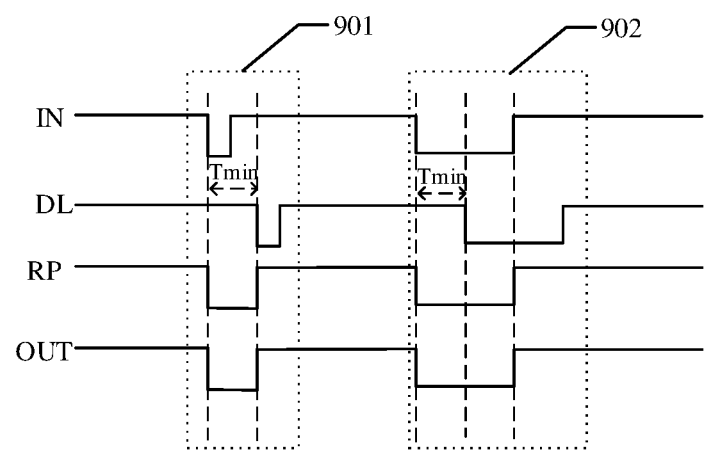
FIG. 9 schematically illustrates a signal waveform diagram corresponding to the signal width repair circuit illustrated in FIG. 8.

FIG. 9 illustrates a waveform diagram corresponding to the input signal IN, the delayed signal DL, the repaired signal RP and the target signal OUT. As illustrated in FIG. 9, when the width of the input signal IN is smaller than a preset width, the waveforms respectively corresponding to the delayed signal DL, the repaired signal RP and the target signal OUT are illustrated in a first region 901. When the delayed signal DL is obtained by the input signal IN delayed for T min, the width of the repaired signal RP is also T min. When the repaired signal RP is signal 0, the waveform of the target signal OUT output by the first multiplexer 531 is the same as the waveform of the repaired signal RP, and the width of the target signal OUT is T min and satisfies the preset width requirement.

When the width of the input signal IN is greater than the preset width, the waveforms respectively corresponding to the delayed signal DL, the repaired signal RP and the target signal OUT are illustrated in a second region 902. When the delayed signal DL is obtained by the input signal IN delayed by T min, the waveform of the repaired signal RP is the same as that of the input signal IN, and the duration with the width of the repaired signal RP is greater than the duration T min of the preset width. When the repaired signal RP is signal 0, the waveform of the target signal OUT output by the first multiplexer 531 is the same as the waveform of the repaired signal RP, and the duration with the width of the target signal OUT is greater than T min and satisfies the preset width requirement.

As illustrated in FIG. 8, the signal width repair circuit provided in the exemplary embodiment may further include a first buffer 540. The first buffer 540 is configured to be disposed in the input line of the first multiplexer 531, the input line is used for receiving the input signal IN. The first buffer 540 is configured to enhance the input signal IN so as to avoid distortion of the input signal IN.

Figure 10:
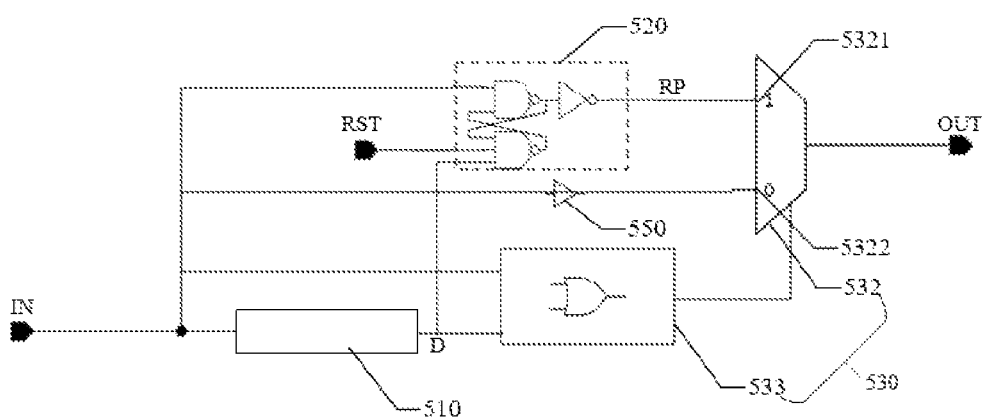
FIG. 10 schematically illustrates a structure diagram of another signal width repair circuit with a signal selection unit including a second multiplexer and a signal width detection unit according to an exemplary embodiment of the present disclosure.

In the exemplary embodiment of the present disclosure, FIG. 10 schematically shows a structure diagram of another signal width repair circuit with a signal selection unit including a second multiplexer and a signal width detection unit according to an exemplary embodiment of the present disclosure. The signal selection unit 530 may include a second multiplexer 532 and a signal width detection unit 533.

As illustrated in FIG. 10, input ends of the signal width detection unit 533 respectively receive the input signal IN and the delayed signal DL, and an output end of the signal width detection unit 533 is connected to a control end of the second multiplexer 532. Input ends of the second multiplexer 532 respectively receive the input signal IN and the repaired signal RP, and an output end of the second multiplexer 532 is configured to output the target signal OUT.

In the exemplary embodiment, the signal selection unit 530 may be configured to select the input signal IN for output when an output signal DS of the signal width detection unit 533 is signal 0, and select the repaired signal RP for output when the output signal DS of the signal width detection unit 533 is signal 1.

In practical applications, the signal width detection unit 533 may be an AND gate. It should be noted that the signal width detection unit 533 may be other structures that may output the repaired signal RP when the width of the input signal IN does not satisfy the preset width requirement; and may output the input signal IN when the width of the input signal IN satisfies the preset width requirement, which is not particularly limited in the exemplary embodiment.

In the exemplary embodiment, the input signal IN is input to input end 0 of the second multiplexer 532, that is, an input end 5322 of the second multiplexer 532 which receives the input signal IN is input end 0. The repaired signal RP is input to input end 1 of the second multiplexer 532, that is, an input end 5321 of the second multiplexer 532 which receives the repaired signal RP is input end 1.

Figure 11:
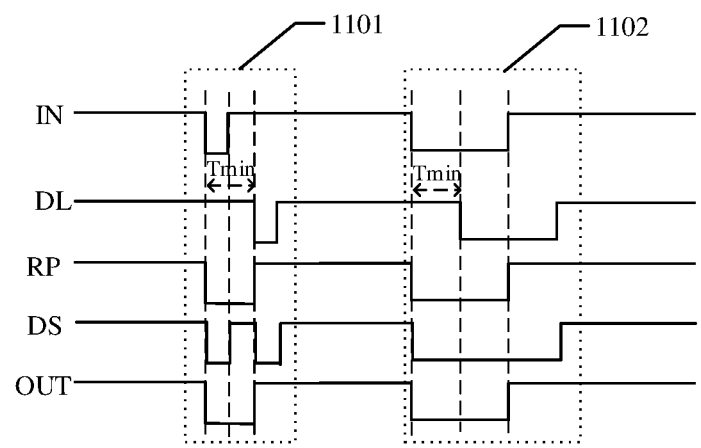
FIG. 11 schematically illustrates a signal waveform diagram corresponding to the signal width repair circuit illustrated in FIG. 10.

FIG. 11 illustrates a waveform diagram corresponding to the signal width repair circuit illustrated in FIG. 10. FIG. 11 illustrates a waveform diagram corresponding to the input signal IN, the delayed signal DL, the repaired signal RP, the output signal DS of the width detection unit and the target signal OUT. When the width of the input signal IN is smaller than the preset width, waveforms respectively corresponding to the delayed signal DL, the repaired signal RP, the output signal DS of the width detection unit and the target signal OUT are illustrated in a first region 1101. When the delayed signal DL is obtained by the input signal IN delayed for T min, the width of the repaired signal RP is T min. The output signal DS in this stage is a multi-segment signal. As illustrated in FIG. 11, when the output signal DS is signal 0, the input signal IN is selected for output, and the output target signal OUT is also low-level signal 0 since the input signal IN is low-level signal 0. When the output signal DS is signal 1, the repaired signal RP is selected for output, and the repaired signal RP is low-level signal 0 at this moment. Finally, the width of the output target signal OUT at a low-level stage is T min and satisfies the preset width requirement.

When the width of the input signal IN is greater than the preset width, waveforms corresponding to the delayed signal DL, the repaired signal RP, the output signal DS of the width detection unit and the target signal OUT are illustrated in a second region 1102. When the delayed signal DL is obtained by the input signal IN delayed for T min, the waveform of the repaired signal RP is the same as the waveform of the input signal IN, and a duration with the width of the repaired signal RP is greater than the duration T min with the preset width. Accordingly, the width of the output signal DS at a low level is a total width of superposition of the input signal IN and the delayed signal DL, and the total width is greater than the width of the input signal IN. As illustrated in FIG. 11, when the output signal DS is signal 0, the input signal IN is selected for output, and the final target signal OUT is the same as the input signal IN, and the width of the target signal OUT at a low level is T min and satisfies the preset width requirement.

Figure 12:
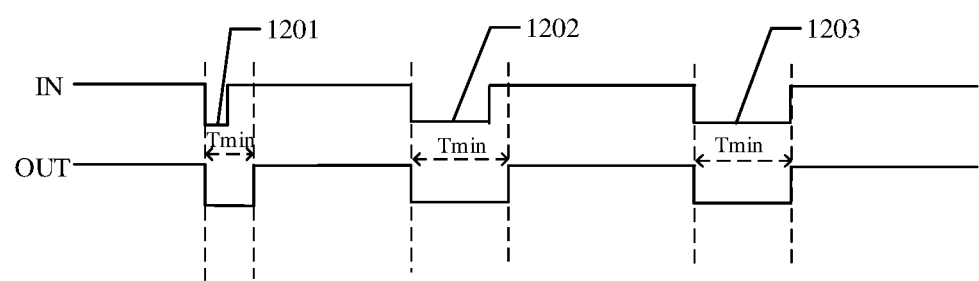
FIG. 12 schematically illustrates a waveform variation diagram of waveforms with different widths passing through the signal width repair circuit according to an exemplary embodiment of the present disclosure.

As can be seen from FIG. 9 and FIG. 11, in a case where the width of the input signal IN is greater than the preset width, the original waveform of the input signal IN would be kept after the input signal IN passes through the signal width repair circuit provided in the exemplary embodiment. As illustrated in FIG. 12, assumed that the input signal IN has three waveforms with different widths, i.e., a first waveform 1201, a second waveform 1202 and a third waveform 1203. The duration with the width of the first waveform 1201 and the duration with the width of second waveform 1202 are both smaller than T min, and the duration with the width of the third waveform 1203 is greater than T min. In the finally obtained target signals OUT, the widths of the target signals OUT corresponding to the first waveform 1201 and the second waveform 1202 are expanded to T min, and the target signal OUT corresponding to the third waveform 1203 keeps the original waveform.

As illustrated in FIG. 10, the signal width repair circuit provided in an exemplary embodiment may further include a second buffer 550. The second buffer 550 is configured to be disposed in an input line of the second multiplexer 532, and the input line is used for receiving the input signal IN. The second buffer 550 is configured to enhance the input signal IN so as to avoid distortion of the input signal IN.

Figure 13:
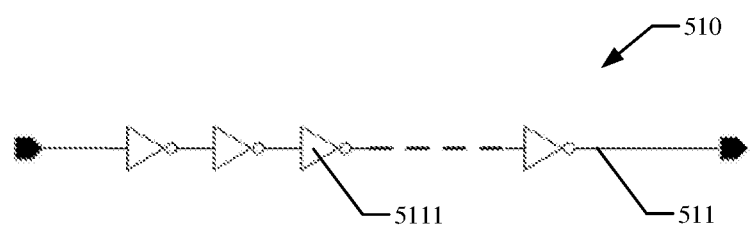
FIG. 13 schematically illustrates a structure diagram of a delay unit according to an exemplary embodiment of the present disclosure.

FIG. 13 schematically illustrates a structure diagram of a delay unit according to an exemplary embodiment of the present disclosure. Alternatively, the delay unit 510 may include at least one inverter string 511. The inverter string 511 may include a plurality of inverters 5111 connected in series. The input signal IN may be delayed through the plurality of inverters 5111.

In practical applications, different numbers of inverters 5111 may respectively delay the input signal IN by different durations, and therefore, the number of inverters 5111 may be selected according to the preset duration.

Figure 14:
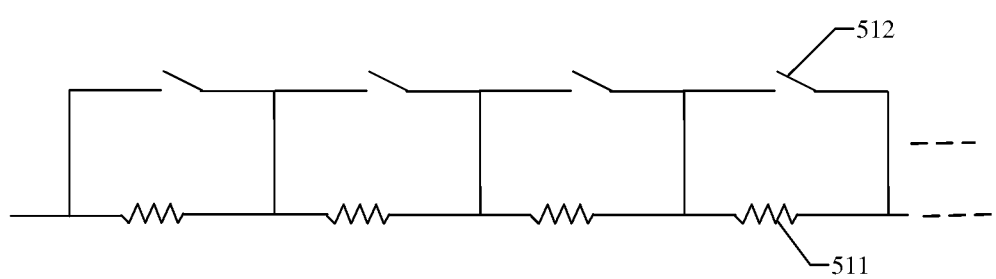
FIG. 14 schematically illustrates a structure diagram of another delay unit according to an exemplary embodiment of the present disclosure.

In the exemplary embodiment, in order to obtain a delay unit 510 with a adjustable delay, a plurality of inverter strings 511 may be connected in series, and a plurality of switches 512 may be provided. Each switch 512 is connected to one inverter string 511 in parallel, as illustrated in FIG. 14. The inverter strings 511 to be connected may be selected according to the preset duration to be delayed, and the inverter strings 511 not to be connected may be short-circuited by closing the corresponding switches 512.

Alternatively, in the exemplary embodiment, the delay unit 510 includes four inverter strings 511 connected in series, and delays of the four inverter strings 511 are 0.1 ns, 0.2 ns, 0.2 ns and 0.5 ns, respectively. The range of preset duration formed by combinations of the four inverter strings 511 may in 0.1 ns-1.0 ns, Table 2 illustrates a specific combination mode.

TABLE 2

| 0.1 ns | 0.2 ns | 0.2 ns | 0.5 ns | Preset duration |
|--------|--------|--------|--------|-----------------|
| √      |        |        |        | 0.1 ns          |
|        | √      |        |        | 0.2 ns          |
| √      | √      |        |        | 0.3 ns          |
|        | √      | √      |        | 0.4 ns          |
|        |        |        | √      | 0.5 ns          |

TABLE 2-continued

| 0.1 ns | 0.2 ns | 0.2 ns | 0.5 ns | Preset duration |
|---|---|---|---|---|
| √ |   |   | √ | 0.6 ns |
|   | √ |   | √ | 0.7 ns |
| √ | √ |   | √ | 0.8 ns |
|   | √ | √ | √ | 0.9 ns |
| √ | √ | √ | √ | 1.0 ns | where √ represents the selected inverter string.

In practical applications, the smaller a width-to-length ratio of the inverter 5111, the smaller the current passed through, and the longer the time required for transmission. Therefore, the delay for the input signal IN may be also longer. Selection of a suitable width-to-length ratio is also a way of obtaining the delayed signal DL with the preset duration. In the exemplary embodiment, the width-to-length ratio of each inverter 5111 is set to be in a range of 1 to 2.

Figure 15:
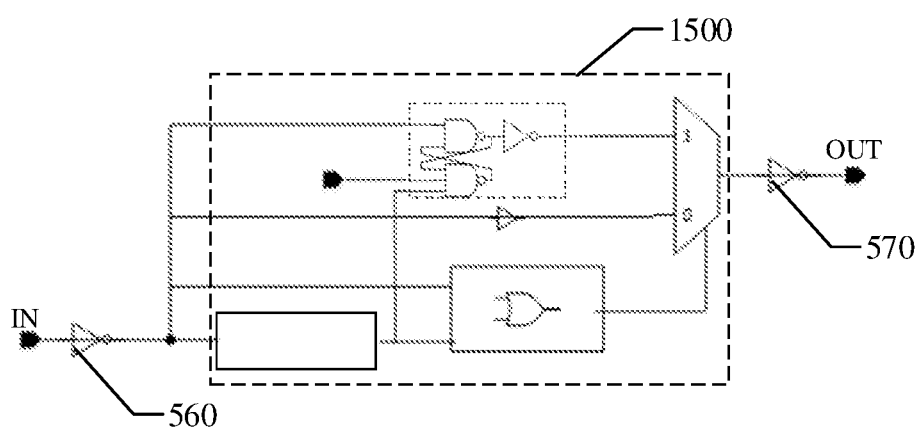
FIG. 15 schematically illustrates a structure diagram of a signal width repair circuit for a high-level signal according to an exemplary embodiment of the present disclosure.

As described above, the above signal width repair circuit provided in the exemplary embodiment is mainly applied to a case where the input signal IN is a low-level signal. When the input signal IN is a high-level signal, as illustrated in FIG. 15, a second NOT gate 560 may be disposed in a line of the input signal IN, and a third NOT gate 570 may be disposed in the output target signal OUT. That is, the input signal IN is inversed before being input to a signal width repair circuit 1500, and after the signal width repair circuit 1500 processes the signal, the output signal OUT may be inversed to obtain a high-level signal.

Figure 16:
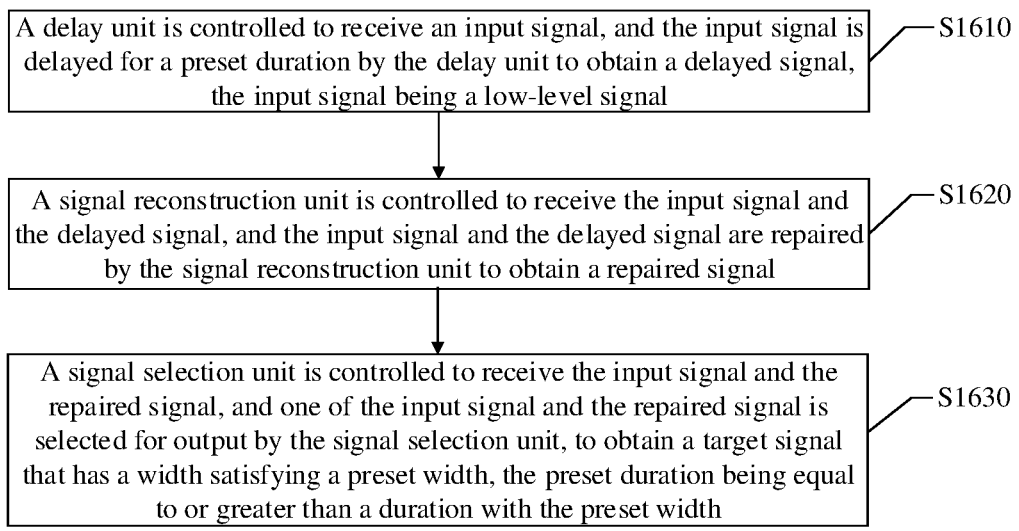
FIG. 16 schematically illustrates a flowchart of a signal width repair method according to an exemplary embodiment of the present disclosure.

FIG. 16 illustrates a flowchart of a signal width repair method according to an exemplary embodiment of the present disclosure. Referring to FIG. 16, the signal width repair method is applied to a signal width repair circuit which includes a delay unit, a signal reconstruction unit and a signal selection unit. The signal width repair method includes the following operations.

At S1610, the delay unit is controlled to receive an input signal, and the delay unit delays the input signal for a preset duration to obtain a delayed signal. The input signal is a low-level signal.

At S1620, the signal reconstruction unit is controlled to receive the input signal and the delayed signal, and the signal reconstruction unit repairs the input signal and the delayed signal to obtain a repaired signal.

At S1630, the signal selection unit is controlled to receive the input signal and the repaired signal, and the signal selection unit selects one of the input signal and the repaired signal for output, to obtain a target signal that has a width satisfying a preset width. The preset duration is equal to or greater than a duration with the preset width.

The details of the delay unit, the signal reconstruction unit and the signal selection unit which specifically perform the operations S1610-S1630 in the signal width repair method have been described in detail in the corresponding signal width repair circuit, and thus will not be elaborated herein.

An exemplary embodiment also provides an electronic device which includes the above signal width repair circuit. After a signal in the electronic device is processed by the signal width repair circuit, the width of the signal can satisfy use requirement of a next-stage circuit, and the strength of the signal can be enhanced.

The technical solution provided by the present disclosure may include the following beneficial effects. Exemplary embodiments of the present disclosure provide a signal width repair circuit which is mainly for processing a case where an input signal is a low-level signal. By receiving an input signal and a delayed signal by the signal reconstruction unit, the input signal is repaired and a repaired signal is obtained. By selectively outputting one of the input signal and the repaired signal by the signal selection unit, a target signal that has a width satisfying a preset width can be obtained. Therefore, the width of the input signal can be repaired, and the signal passing through the signal width repair circuit can finally satisfy the use requirement of the preset width.

The above embodiments may be implemented in whole or in part by software, hardware, firmware, or any combination thereof. When implemented by using a software program, it may be implemented in whole or in part in the form of a computer program product. The computer program product includes one or more computer instructions. The processes or functions described in accordance with the embodiments of the present disclosure are generated, in whole or in part, when computer program instructions are loaded and executed on a computer. The computer may be a general purpose computer, a special purpose computer, a computer network, or another programmable apparatus. The computer instructions may be stored in a computer-readable storage medium or may be transmitted from one computer-readable storage medium to another computer-readable storage medium. The computer-readable storage medium may be any available medium that can be accessed by the computer or may include one or more media-integrated data storage devices such as servers or data centers. The available medium may be a magnetic medium (e.g., a floppy disk, a hard disk or a magnetic tape), an optical medium (e.g., a DVD), or a semiconductor medium (e.g., a Solid State Disk (SSD)), etc. In the embodiments of the present disclosure, the computer may include the devices previously described.

Although the present disclosure has been described herein in conjunction with various embodiments, other variations to the disclosed embodiments may be understood and achieved by those skilled in the art when practicing the claimed disclosure, from a review of the drawings, the disclosure, and the appended claims. In the claims, the word "comprising" does not exclude other components or steps, and the word "a/an" or "one" does not exclude the multiple cases. A single processor or other units may implement several functions recited in the claims. Certain operations are recited in mutually different dependent claims, which does not mean that a combination of these operations cannot generate advantages.

Although the present disclosure has been described in conjunction with specific features and embodiments thereof, it will be apparent that various modifications and combinations can be made thereto without departing from the spirit and scope of the present disclosure. Accordingly, the specification and drawings are merely illustrative of the present disclosure which is defined by the appended claims, and are to be considered as covering any and all modifications, changes, combinations, or equivalents falling within the scope of the present disclosure. Apparently, those skilled in the art may make various modifications and variations for the present disclosure without departing from the spirit and scope of the present disclosure. Thus, if these modifications and variations of the present disclosure fall within the scope of claims of the present disclosure and an equivalent technology thereof, the present disclosure is also intended to include these modifications and variations.

The invention claimed is:

1. A signal width repair circuit, comprising:
a delay circuit, configured to receive an input signal, and delay the input signal for a preset duration to obtain a delayed signal, the input signal being a low-level signal;
a signal reconstruction circuit, configured to receive the input signal and the delayed signal, and repair the input signal and the delayed signal to obtain a repaired signal; and
a signal selection circuit, configured to receive the input signal and the repaired signal, and select one of the input signal and the repaired signal for output, to obtain a target signal that has a width satisfying a preset width, wherein the preset duration is equal to or greater than a duration with the preset width.

2. The signal width repair circuit of claim 1, wherein the signal reconstruction circuit comprises a first NAND gate, a second NAND gate and a first NOT gate, and wherein
input ends of the first NAND gate are respectively connected with the input signal and an output signal of the second NAND gate;
input ends of the second NAND gate are respectively connected with a system reset signal, the delayed signal and an output signal of the first NAND gate; and
an input end of the first NOT gate is connected with an output end of the first NAND gate, and an output end of the first NOT gate is configured to output the repaired signal that has a width satisfying the preset width.

3. The signal width repair circuit of claim 1, wherein the signal selection circuit is a first multiplexer;
input ends of the first multiplexer respectively receive the input signal and the repaired signal, a control end of the first multiplexer receives the repaired signal, and an output end of the first multiplexer is configured to output the target signal; and
the first multiplexer is configured to select the repaired signal for output in response to the repaired signal being a signal 0, and select the input signal for output in response to the repaired signal being a signal 1.

4. The signal width repair circuit of claim 3, wherein the input signal is input to an input end 1 of the first multiplexer, and the repaired signal is input to an input end 0 of the first multiplexer.

5. The signal width repair circuit of claim 3, further comprising:
a first buffer configured to be disposed in an input line of the first multiplexer, the input line being used for receiving the input signal.

6. The signal width repair circuit of claim 1, wherein the signal selection circuit comprises a second multiplexer and a signal width detection circuit, and wherein
input ends of the signal width detection circuit respectively receive the input signal and the delayed signal, and an output end of the signal width detection circuit is connected to a control end of the second multiplexer;
input ends of the second multiplexer respectively receive the input signal and the repaired signal, and an output end of the second multiplexer is configured to output the target signal; and
the signal selection circuit is configured to select the input signal for output in response to an output signal of the signal width detection circuit being signal 0, and select the repaired signal for output in response to the output signal of the signal width detection circuit being signal 1.

7. The signal width repair circuit of claim 6, wherein the input signal is input to an input end 0 of the second multiplexer, and the repaired signal is input to an input end 1 of the second multiplexer.

8. The signal width repair circuit of claim 6, wherein the signal width detection circuit is an AND gate.

9. The signal width repair circuit of claim 6, further comprising:
a second buffer configured to be disposed in an input line of the second multiplexer, the input line being used for receiving the input signal.

10. The signal width repair circuit of claim 1, wherein the delay circuit comprises at least one inverter string, and each inverter string comprises a plurality of inverters connected in series.

11. The signal width repair circuit of claim 10, wherein the delay circuit further comprises a plurality of switches, a plurality of inverter strings in the delay circuit are connected in series, and each of the plurality of switches is connected to a respective one of the plurality of inverter strings in parallel.

12. The signal width repair circuit of claim 11, wherein the delay circuit comprises four inverter strings connected in series, and delays of the four inverter strings are 0.1 ns, 0.2 ns, 0.2 ns and 0.5 ns, respectively.

13. The signal width repair circuit of claim 1, wherein the preset duration is in a range of 0.1 ns-1.0 ns.

14. The signal width repair circuit of claim 10, wherein a width-to-length ratio of each inverter is in a range of 1 to 2.

15. A signal width repair method, applied to a signal width repair circuit comprising a delay circuit, a signal reconstruction circuit and a signal selection circuit, the signal width repair method comprising:
controlling the delay circuit to receive an input signal, and delaying, by the delay circuit, the input signal for a preset duration to obtain a delayed signal, the input signal being a low-level signal;
controlling the signal reconstruction circuit to receive the input signal and the delayed signal, and repairing, by the signal reconstruction circuit, the input signal and the delayed signal to obtain a repaired signal; and
controlling the signal selection circuit to receive the input signal and the repaired signal, and selecting, by the signal selection circuit, one of the input signal and the repaired signal for output, to obtain a target signal that has a width satisfying a preset width, wherein the preset duration is equal to or greater than a duration with the preset width.

16. An electronic device, comprising a signal width repair circuit, wherein the signal width repair circuit comprises:
a delay circuit, configured to receive an input signal, and delay the input signal for a preset duration to obtain a delayed signal, the input signal being a low-level signal;
a signal reconstruction circuit, configured to receive the input signal and the delayed signal, and repair the input signal and the delayed signal to obtain a repaired signal; and
a signal selection circuit, configured to receive the input signal and the repaired signal, and select one of the input signal and the repaired signal for output, to obtain a target signal that has a width satisfying a preset width, wherein the preset duration is equal to or greater than a duration with the preset width.

17. The electronic device of claim 16, wherein the signal reconstruction circuit comprises a first NAND gate, a second NAND gate and a first NOT gate, and wherein input ends of the first NAND gate are respectively connected with the input signal and an output signal of the second NAND gate;

input ends of the second NAND gate are respectively connected with a system reset signal, the delayed signal and an output signal of the first NAND gate; and an input end of the first NOT gate is connected with an output end of the first NAND gate, and an output end of the first NOT gate is configured to output the repaired signal that has a width satisfying the preset width.

18. The electronic device of claim 16, wherein the signal selection circuit is a first multiplexer;

input ends of the first multiplexer respectively receive the input signal and the repaired signal, a control end of the first multiplexer receives the repaired signal, and an output end of the first multiplexer is configured to output the target signal; and the first multiplexer is configured to select the repaired signal for output in response to the repaired signal being a signal 0, and select the input signal for output in response to the repaired signal being a signal 1.

19. The electronic device of claim 18, wherein the input signal is input to an input end 1 of the first multiplexer, and the repaired signal is input to an input end 0 of the first multiplexer.

20. The electronic device of claim 18, wherein the signal width repair circuit further comprises:

a first buffer configured to be disposed in an input line of the first multiplexer, the input line being used for receiving the input signal.

* * * * *